United States Patent [19]
Steinberg

[11] Patent Number: 5,567,255
[45] Date of Patent: Oct. 22, 1996

[54] SOLID ANNULAR GAS DISCHARGE ELECTRODE

[75] Inventor: George N. Steinberg, Westport, Conn.

[73] Assignee: Integrated Process Equipment Corp., Phoenix, Ariz.

[21] Appl. No.: 322,820

[22] Filed: Oct. 13, 1994

[51] Int. Cl.$^6$ ............................................... H01L 21/3065
[52] U.S. Cl. .................... 156/345; 156/643.1; 156/646.1; 216/67
[58] Field of Search ............................ 156/345 P, 643.1, 156/646.1; 216/67

[56] References Cited

U.S. PATENT DOCUMENTS

| | | | |
|---|---|---|---|
| 4,612,077 | 9/1986 | Tracy et al. | 156/345 |
| 4,614,639 | 9/1986 | Hegedus | 156/345 |
| 4,812,201 | 3/1989 | Sakai et al. | 156/643.1 |
| 5,074,456 | 12/1991 | Degner et al. | 156/345 |
| 5,113,790 | 5/1992 | Geisler et al. | 156/345 |
| 5,372,674 | 12/1994 | Steinberg | 156/345 |
| 5,423,936 | 6/1995 | Tomita et al. | 156/643.1 |

*Primary Examiner*—T. Tung
*Attorney, Agent, or Firm*—Cahill, Sutton & Thomas P.L.C.

[57] ABSTRACT

Gas discharge apparatus comprising an annular gas-emitting electrode for use with wafer etching systems, and the like. The gas discharge apparatus comprises a housing and an annular electrode having provisions for cooling the electrode having predetermined outer and inner diameters secured to the housing. An inert outer chimney is disposed against a face of the annular electrode adjacent its outer diameter and an inert inner chimney is disposed against the face of the annular electrode adjacent its inner diameter. The inner and outer chimneys confine the gas discharge from the annular electrode to its face. An insulator is secured to the housing that has an opening that permits the flow of etching gas therethrough to produce a radially symmetric flow pattern. The insulator is disposed within the inner chimney and is centered relative to the annular electrode. The nonconducting components of the gas discharge apparatus are typically made of inert materials such as MACOR® ceramic, magnesium oxide, and magnesium fluoride, for example. The housing may be made of aluminum so that it can be water cooled, for example, to remove heat from the annular electrode during etching, or the electrode may be directly cooled. The gas discharge apparatus introduces the gas at the center of the annular electrode without causing any secondary discharge. Consequently, sufficiently high etch rates are achieved. The annular electrode does not exhibit erosion effects at very high power and very high gas flow rates. The annular electrode provides a removal profile with a relatively high spatial frequency which provides for a finer scale of correction of wafer surfaces.

13 Claims, 2 Drawing Sheets

SOLID ANNULAR GAS DISCHARGE ELECTRODE

BACKGROUND

The present invention relates to wafer etching systems, and the like, and more particularly, to gas discharge apparatus comprising an annular electrode for use with wafer etching systems.

The assignee of the present invention improves the flatness of semiconductor wafers using an etching system. In order to achieve an economically practical through-put of processed wafers per hour, a sufficiently high etch rate (or volume removal rate) must be obtained. Major factors affecting the wafer etching process are the process gas flow, how it is introduced into the etching chamber, and the discharge power. The currently-used design (known as a quasi-shower head electrode) tends to require a great deal of gas flow to increase the etch rate. It exhibits erosion effects at very high power and very high gas flow rates. The quasi-shower head electrode includes several precision pieces and is relatively complex and costly to build.

The original quasi-shower head used in the etching chamber employed a two inch diameter electrode that used two gas inlet rings. This design was later changed to use three gas inlet rings. Although higher flow rates were achieved with the modified design, most of the additional flow was introduced at the periphery of the electrode and sufficiently high etch rates could not be achieved. The gas inlet rings limit the amount of gas that can be introduced into the discharge without eroding the electrode.

Therefore, it is an objective of the present invention to provide for improved gas discharge apparatus for use with wafer etching systems capable of very high etch rates comprising an annular electrode where etching gas is introduced at the center of the annulus. It is a further objective of the present invention to provide for improved gas discharge apparatus that does not exhibit the erosion effects of conventional electrodes.

SUMMARY OF THE INVENTION

In order to meet the above and other objectives, the present invention comprises gas discharge apparatus comprising an annular electrode for use with wafer etching systems, and the like. The gas discharge apparatus comprises a housing and an annular electrode having a predetermined outer diameter and a predetermined inner diameter secured to the cooled housing. An inert outer chimney is disposed against a face of the annular electrode adjacent its outer diameter and an inert inner chimney is disposed against the face of the annular electrode adjacent its inner diameter. The inner and outer chimneys confine the gas discharge from the annular electrode to the face thereof. An insulator is secured to the housing that has an opening therethrough that permits the flow of etching gas therethrough to produce a radially symmetric flow pattern, and wherein the insulator is disposed within the inner chimney and centered relative to the annular electrode. The components of the gas discharge apparatus are typically made of inert materials such as MACOR® ceramic (a machinable ceramic available in rod and sheet form from Corning Glass), magnesium fluoride, or magnesium oxide, for example. The housing may be made of aluminum so that it can be water cooled, for example, to remove heat from the annular electrode during etching. Alternatively, the electrode may be water cooled directly by a suitable arrangement of passages and seals.

The gas discharge apparatus introduces the gas at the center of the annular electrode without causing any secondary discharge. The practical effect of this is that sufficiently high etch rates are achieved. The annular electrode does not exhibit erosion effects typical of conventional quasi-shower head electrodes at very high power and very high gas flow rates. The one piece design of the annular electrode is simpler to fabricate than quasi-shower head electrodes which include several precision pieces.

The annular electrode is configured such that process gas is introduced through a central hole, or opening, not through many small holes as in a conventional shower head electrode or through narrow rings as in the conventional quasi-shower head electrode. The annular electrode provides a removal profile with higher spatial frequency than that of conventional electrodes having the same outer diameter, which provides for a finer scale of correction of the wafer surface.

A major advantage of the solid annular electrode of the present gas discharge apparatus is that higher volume removal rates are achieved consistent with acceptable etching than have been achieved with scaled-up versions of the quasi-shower head electrode. A secondary advantage of the solid annular electrode used in the gas discharge apparatus of the present invention is its ability to correct higher spatial frequencies than non-annular electrodes.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
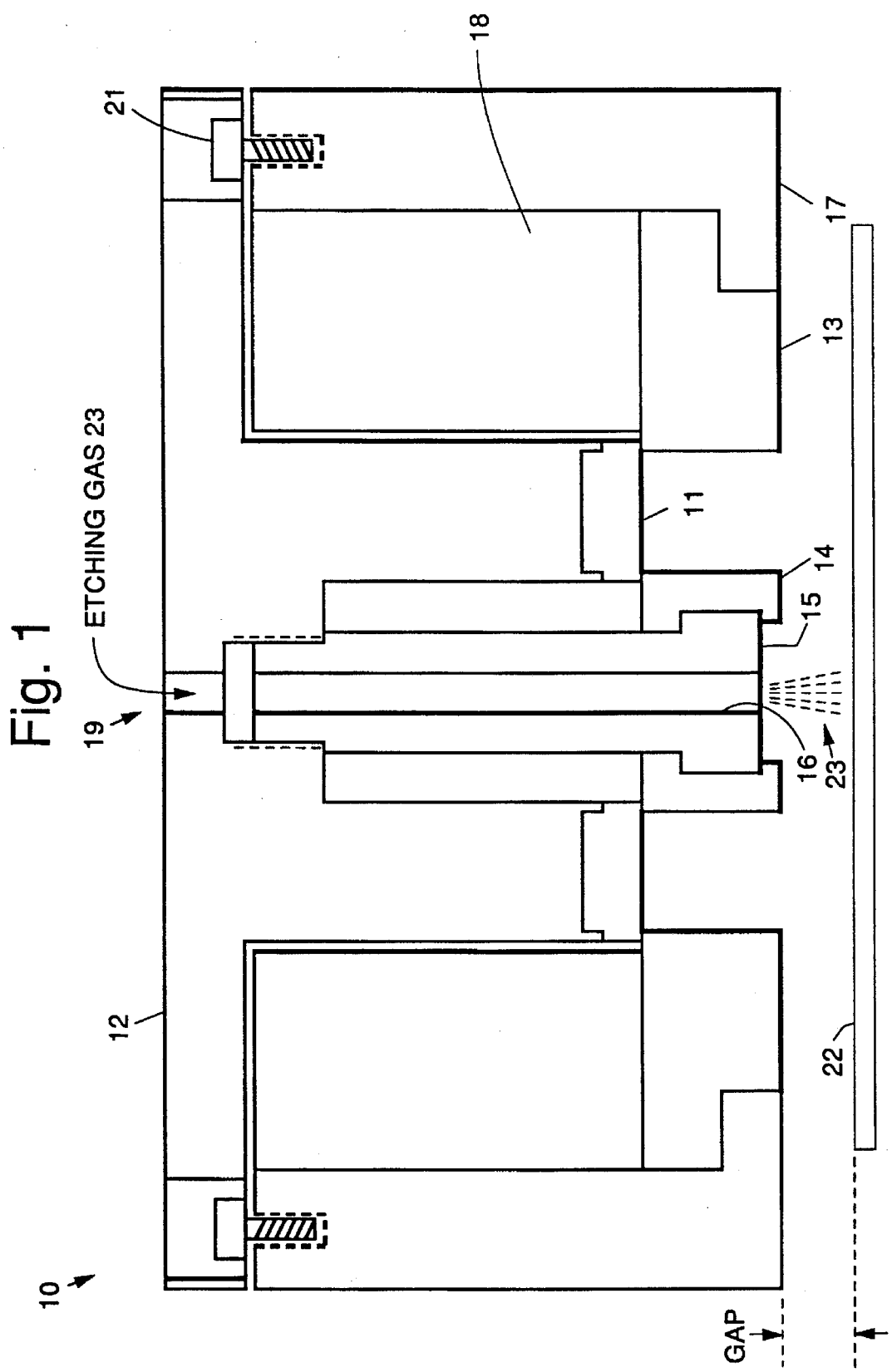
FIG. 1 shows a cross sectional view of gas discharge apparatus in accordance with the principles of the present invention.

Referring to the drawing figures, FIG. 1 shows a cross sectional view of gas discharge apparatus 10 employing an annular electrode 11 in accordance with the principles of the present invention. The gas discharge apparatus 10 may be employed to etch a wafer 22, for example. The gas discharge apparatus 10 may be used with wafer etching systems capable of very high etch rates. The gas discharge apparatus 10 comprises an annular electrode 11 wherein etching gas 23 is introduced at the center of the annulus of the electrode 11, and the electrode 11 does not exhibit erosion effects.

The gas discharge apparatus 10 comprises a housing 12, or holder 12, and the annular electrode 11 which has a predetermined outer diameter and a predetermined inner diameter secured to the housing 12. An inert outer chimney 13 is disposed against a face of the annular electrode 11 adjacent its outer diameter and an inert inner chimney 14 is disposed against the face of the annular electrode 11 adjacent its inner diameter. The outer and inner chimneys 13, 14 confine the gas discharge from the annular electrode 11 to the face thereof. An insulator 15 is secured to the housing 12 that has an opening 16, or hole 16, therethrough that permits the flow of etching gas 23 therethrough to produce a radially symmetric flow pattern. The insulator 15 is disposed within the inner chimney 14 and centered relative to the annular electrode 11. The electrode 11 may be cooled using a fluid such as water, for example. The outer chimney 13 is secured to the housing 12 by means of a clamp 17 that is mated to the housing 12 by means of a plurality of bolts 21, for example. An inert filler member 18 is disposed in the space between the housing 12, clamp 17, and outer chimney 13.

More specifically, the annular electrode 11 may be comprised of a magnesium annulus having a two inch outer diameter and a one inch inner diameter that is pressed into a water cooled housing 12, which may be comprised of aluminum, for example. The outer chimney 13, which may be comprised of magnesium fluoride material, for example, is held against a face of the annular electrode 11 at its outer diameter by the clamp 17, which is made from MACOR® ceramic, for example. The outer chimney 13 may be made of other inert materials such as magnesium oxide, for example.

The inner chimney 14, which may be comprised of macor material, for example, is held against the face of the annular electrode 11 at its inner diameter by the insulating bolt 15, made from MACOR® ceramic, for example. The inner chimney 14 may also be made of other inert materials such as magnesium fluoride or magnesium oxide, for example.

A process gas 23, such as sulfur hexafluoride, for example, is introduced through bolt 15 so that it has a radially symmetric flow. Bolt 15 includes a longitudinal hole approximately 1/8 inch in diameter and has a length long enough to prevent gas discharge from occurring at an inlet 19 where the gas 23 enters the aluminum housing 12.

Figure 2:
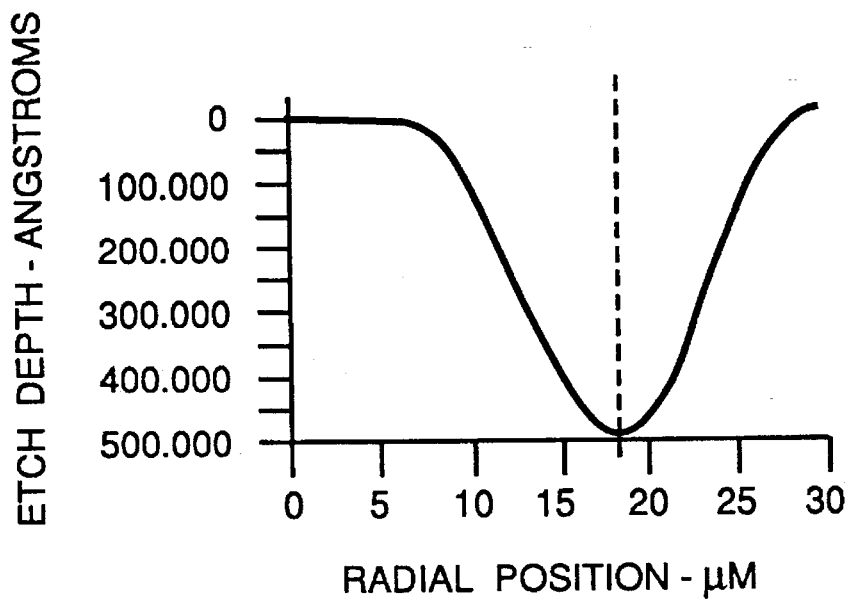
FIG. 2 shows a graph illustrating the wafer profile produced by the gas discharge apparatus of FIG. 1 using a four millimeter gap.
Figure 3:
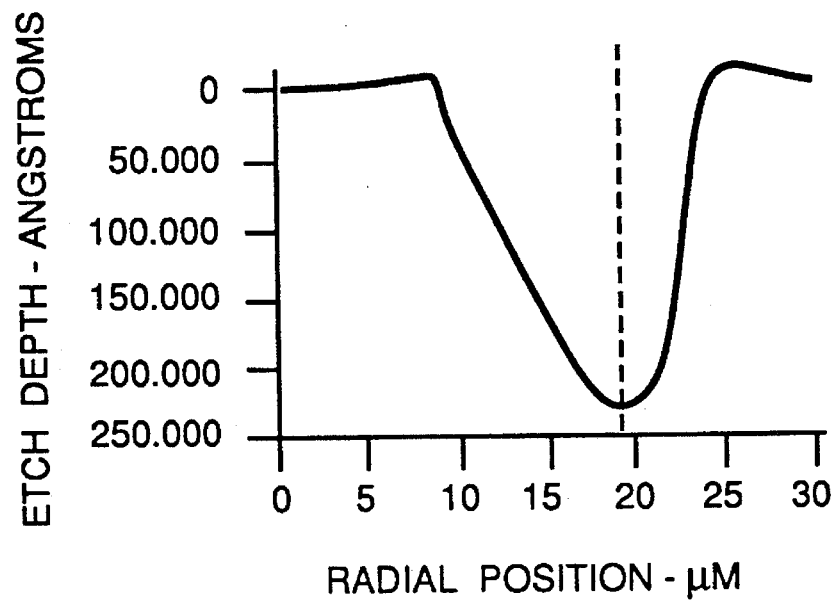
FIG. 3 shows a graph illustrating the wafer profile produced by the gas discharge apparatus of FIG. 1 using a one millimeter gap.

The annular electrode 11 has been built and tested. Acceptable etching of wafers 22 has been achieved using the annular electrode 11 at a volume removal rate of 1.0 mm³/second. FIGS. 2 and 3 illustrate wafer profiles of the annular electrode 11 using four millimeter and one millimeter gaps, respectively, between the face of the outer and inner chimneys 13, 14 and the upper surface of the wafer 22 that is being etched. The gap is illustrated in FIG. 1.

The etching footprint of the annular electrode 11 is a two inch outer diameter and a one inch inner diameter annulus. Radial scans from the center of the annulus outward are shown in FIGS. 2 and 3, and the gas discharge profile has a 1/2 inch width. This gas discharge profile allows for correcting smaller features than is possible with a two inch diameter footprint. This is extremely useful when the annular electrode 11 is scanned off the wafer 22 to correct for edge effects.

The process gas 23 is introduced into annular electrode 11 at the center thereof without causing any secondary discharge, such as at inlet 19 where gas 23 enters bolt 15 from housing 12. Consequently, sufficiently high etch rates are achieved. The annular electrode 11 does not exhibit erosion effects typical of quasi-shower head electrodes at very high power and very high gas flow rates. The one piece annular design of the annular electrode 11 is also simpler to fabricate than the conventional electrodes.

The annular electrode 11 provides for higher volume removal rates consistent with acceptable etching compared with conventional electrodes. The annular electrode 11 also corrects higher spatial frequencies when compared with conventional non-annular electrodes. The annular electrode 11 may also eliminate the need for a second smaller electrode used to make finer corrections. Features on the wafer 22 that have a characteristic size (diameter) equal to about one-fifth the characteristic size of the electrode are practical to correct (or to remove if the object is to produce a flat wafer 22). The characteristic size of a two inch diameter electrode is two inches, the characteristic size of an annular electrode having a two inch outer diameter and a one inch inner diameter is one half inch. Thus an annular electrode can correct features that have a size on the order of 0.1 inch versus correction of features on the order of 0.4 inch for a two inch diameter electrode. This feature may be as important as achieving a high removal rate.

Thus there has been described a new and improved gas discharge apparatus for use with wafer etching systems capable of very high etch rates comprising an annular electrode where etching gas is introduced at the center of the annulus, and which does not exhibit erosion effects. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Gas discharge apparatus for use in plasma etching apparatus, said gas discharge apparatus comprising:
   a housing;
   an annular electrode having a predetermined outer diameter and a predetermined inner diameter secured to the housing;
   an annular outer chimney disposed against a face of the annular electrode adjacent its outer diameter;
   an annular inner chimney disposed against the face of the annular electrode adjacent its inner diameter, and wherein the inner chimney and the outer chimney are insulators and confine plasma discharge from the annular electrode to the face thereof;
   a hollow bolt secured to the housing and passing through the inner chimney and the annular electrode, said hollow bolt conveying etching gas through said electrode and dispersing said gas in a radially symmetric flow pattern.

2. The apparatus of claim 1 wherein the housing is water cooled.

3. The apparatus of claim 1 wherein the housing is made from aluminum.

4. The apparatus of claim 1 wherein the annular electrode comprises a directly cooled electrode.

5. The apparatus of claim 1 wherein the annular electrode is made from magnesium.

6. The apparatus of claim 1 wherein the annular electrode is pressed into the housing.

7. The apparatus of claim 1 wherein the outer chimney is made from magnesium fluoride.

8. The apparatus of claim 1 wherein the outer chimney is made from magnesium oxide.

9. The apparatus of claim 1 further comprising a clamp for securing the outer chimney against the face of the annular electrode.

10. The apparatus of claim 1 wherein the inner chimney is made from magnesium fluoride.

11. The apparatus of claim 1 wherein the inner chimney is made from magnesium oxide.

12. The apparatus of claim 1 wherein the inner chimney is held against the face of the annular electrode adjacent its inner diameter by the bolt.

13. The apparatus of claim 1 wherein the bolt has a predetermined length thereby preventing a plasma discharge at an inlet where the gas enters the housing and the bolt includes a hole having a predetermined diameter such that the etching gas readily passes therethrough.

* * * * *